United States Patent
Hattori et al.

(10) Patent No.: US 6,689,283 B2
(45) Date of Patent: Feb. 10, 2004

(54) DRY ETCHING METHOD, MICROFABRICATION PROCESS AND DRY ETCHING MASK

(75) Inventors: Kazuhiro Hattori, Tokyo (JP); Kenji Uchiyama, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/816,374

(22) Filed: Mar. 26, 2001

(65) Prior Publication Data

US 2002/0028359 A1 Mar. 7, 2002

(30) Foreign Application Priority Data

Mar. 28, 2000 (JP) ......................................... 2000-088633

(51) Int. Cl.[7] .............................. C23F 1/00; B32B 9/00; B44C 1/22
(52) U.S. Cl. ............................. 216/22; 216/40; 216/72; 216/75; 427/468; 427/131; 427/250; 427/405; 427/419.7
(58) Field of Search ................................. 216/6, 13, 40, 216/49, 51, 57, 74, 22, 67, 72, 75; 427/468, 131, 250, 405, 419.7

(56) References Cited

U.S. PATENT DOCUMENTS

| | | | | |
|---|---|---|---|---|
| 4,998,157 A | * | 3/1991 | Yokoyama et al. | 148/DIG. 19 |
| 5,907,791 A | * | 5/1999 | Cappuzzo et al. | 438/637 |
| 6,136,214 A | * | 10/2000 | Mori et al. | 118/723 R |
| 6,204,167 B1 | * | 3/2001 | Taniguchi | 257/751 |
| 6,287,975 B1 | * | 9/2001 | DeOrnellas et al. | 438/710 |
| 6,291,886 B1 | * | 9/2001 | Sonoda et al. | 257/437 |
| 6,296,777 B1 | * | 10/2001 | Engelhardt et al. | 216/40 |
| 6,342,133 B2 | * | 1/2002 | D'Couto et al. | 204/192.17 |
| 6,391,216 B1 | * | 5/2002 | Nakatani | 216/41 |
| 6,410,193 B1 | * | 6/2002 | Stivers et al. | 382/144 |
| 2001/0001741 A1 | * | 5/2001 | Akahori et al. | 438/706 |
| 2002/0068433 A1 | * | 6/2002 | Trivedi et al. | 438/627 |
| 2002/0072223 A1 | * | 6/2002 | Gilbert et al. | 438/629 |
| 2002/0076936 A1 | * | 6/2002 | Iguchi | 438/710 |

FOREIGN PATENT DOCUMENTS

| | | |
|---|---|---|
| JP | 6-283464 | 10/1994 |
| JP | 11-54620 | 2/1999 |
| JP | 11-92971 | 4/1999 |

\* cited by examiner

*Primary Examiner*—Allan Olsen
(74) *Attorney, Agent, or Firm*—Armstrong, Westerman & Hattori, LLP

(57) ABSTRACT

A dry etching is performed using a mask made of a titanium nitride under a reaction gas of a carbon monoxide with an additive of a nitrogen containing compound gas.

2 Claims, 5 Drawing Sheets

DRY ETCHING METHOD, MICROFABRICATION PROCESS AND DRY ETCHING MASK

FIELD OF THE INVENTION

The present invention relates to a dry etching method for fabricating a microdevice such as for example a micro-semiconductor device or a micromagnetic device, to a microfabrication process or method using this dry etching method and to a dry etching mask.

DESCRIPTION OF THE RELATED ART

When manufacturing a microdevice, such as a micro-semiconductor device and a micromagnetic device, a microfabrication process utilizing both a lithography technology and an etching technology is executed abundantly.

The lithography technology is used to fabricate an etching mask by forming a micro-pattern on a photosensitive film such as a resist film coated on a surface of a work layer, and the etching technology is used to transfer thus formed micro-pattern of the etching mask to the work layer.

As one of the etching technology for providing a microstructure, there is a reactive ion etching method utilizing plasma of a low pressure reaction gas. If a plasma of a reaction gas $CF_4$ or $CCl_4$ is provided in the reactive etching of a magnetic material with transition metal elements such as Fe, Co or Ni for example as the main ingredient, a halogen compound can be formed as well as done in the reactive etching of a semiconductor material. However, since the halogen compound of the transition metal has an extremely higher coupling energy than that of a halogen compound of a semiconductor element, it is not only hard to evaporate but also is unaffected by the sputtering reaction. Therefore, an etching reaction of the transition metal halogen compound seldom progresses.

In order to solve these problems, a new reaction system using a plasma of a carbon monoxide gas had been developed and, by improving this system, a dry etching method using as a reaction gas a carbon monoxide gas with an additive of nitrogen consisting compound gas was proposed (Japanese patent publication 08253881A and Isao Nakatani, "Fabrications of Microstructures of Magnetic Materials", Jpn. J. Appl. Mag., Vol.22, No.11, pp.1383–1389, 1998).

In these literatures, described are experimental results of a reactive ion etching on a permalloy thin-film using as a reaction gas a carbon monoxide (CO) gas with an additive of an ammonia ($NH_3$) gas in order to make a pattern with a size of about 0.6 $\mu$m, and of the similar reactive ion etchings on a silicon (100) monocrystal and on an aluminoborosilicate glass for comparison. The results are that a ratio of an etching rate of the silicon (100) monocrystal with respect to an etching rate of the permalloy is four, and that a ratio of an etching rate of the aluminoborosilicate glass with respect to an etching rate of the permalloy is nine.

However, in the latest etching process requesting a more fine etching pattern, if a ratio of etching rates between the mask and the work layer is so small as this level, it is difficult to transfer the fine pattern of the mask on the work layer with maintaining its precise shape. This is because the mask itself will be etched and will be deformed before the desired part of the work layer is entirely etched, and also because etching of the work layer will progress from mask edge due to side etching. Particularly, this tendency is strong in a pattern with a trench width or a line width of 0.1 $\mu$m or less and thus it is very difficult to transfer such the fine pattern on a work layer with keeping its precise shape.

SUMMARY OF THE INVENTION

It is therefore an object of the present invention to provide a dry etching method, a microfabrication method and a dry etching mask, whereby a microfabrication with keeping its precise shape can be performed.

According to the present invention, a dry etching method include a step of preparing a layer to be etched and a step of dry-etching the layer using a mask made of a titanium nitride under a reaction gas of a carbon monoxide with an additive of a nitrogen containing compound gas.

According to the present invention, also, a microfabrication method includes a step of forming a mask made of a titanium nitride on a layer to be etched, and a step of dry-etching the layer using the mask under a reaction gas of a carbon monoxide with an additive of a nitrogen containing compound gas.

In dry-etching process executed under a reaction gas of a carbon monoxide with an additive of a nitrogen containing compound gas, a titanium nitride with a low etching rate is used as a mask material. Thus, it is possible to increase a ratio between the etching rate of the mask and that of the layer to be etched, and therefore the mask itself will not be deformed by etching and also etching of the layer to be etched will not progress from mask edge due to side etching. As a result, a fine micro-pattern can be transferred on the work layer with keeping its precise shape.

It is preferred that the step of forming a mask includes forming a resist pattern on the layer to be etched and reactive-sputtering a mask layer using a titanium target under a reaction gas containing at least a nitrogen gas.

It is also preferred that the reaction gas containing at least a nitrogen gas is a mixture gas of an argon gas and a nitrogen gas. In this case, it is preferred that a ratio X of a flow rate of the nitrogen gas with respect to a total gas flow rate is 0%<X≦50%, more preferably 30%≦X≦40%, where $X=V_{N2}/(V_{Ar}+V_{N2})$, $V_{N2}$ is a nitrogen gas flow rate and $V_{Ar}$ is an argon gas flow rate.

It is also preferred that the step of forming a mask includes forming a resist pattern on the layer to be etched and sputtering a mask layer using a titanium nitride target.

According to the present invention, furthermore, a dry etching mask used in dry-etching under a reaction gas of a carbon monoxide with an additive of a nitrogen containing compound gas is made of a titanium nitride.

Further objects and advantages of the present invention will be apparent from the following description of the preferred embodiments of the invention as illustrated in the accompanying drawings.

DESCRIPTION OF THE PREFERRED EMBODIMENTS

FIGS. 1a–1f schematically illustrate a part of a microfabrication method in a preferred embodiment according to the present invention.

Figure 1A:
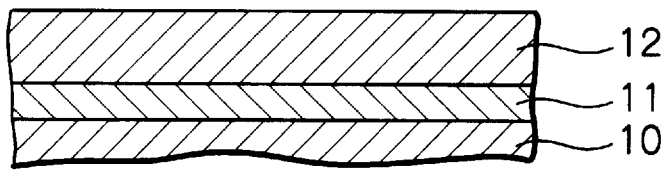
FIGS. 1a–1f show sectional views schematically illustrating a part of a microfabrication method in a preferred embodiment according to the present invention.

First, as shown in FIG. 1a, on an under layer 11 formed on a substrate 10, a microfabrication-work layer or a layer to be etched 12 is deposited. More concretely, for example, on the substrate 10 consisting of a three inches silicon wafer, a titanium (Ti) layer is deposited as the under layer 11 under the following conditions. Then, on the under layer 11, a cobalt-platinum (CoPt) alloy (Co: 75 at %, Pt: 25 at %) layer is deposited as the layer to be etched 12 under the following conditions.

| Deposition conditions of the under layer | |
| --- | --- |
| Target | 99.995% purity titanium |
| Background pressure | $9 \times 10^{-6}$ Pa |
| Entered gas | argon gas |
| Rate of gas flow | 30 sccm |
| Total gas pressure | 0.15 Pa (during deposition) |
| Applied power | DC 500 W |
| Temperature of substrate | room temperature (cooling by cold water, no temperature control) |
| Deposition conditions of the layer to be etched | |
| Target | 99.995% purity cobalt-platinum |
| Background pressure | $9 \times 10^{-6}$ Pa |
| Entered gas | argon gas |
| Rate of gas flow | 100 sccm |
| Total gas pressure | 2.0 Pa (during deposition) |
| Applied power | RF 500 W |
| Temperature of substrate | room temperature (cooling by cold water, no temperature control) |

Figure 1B:
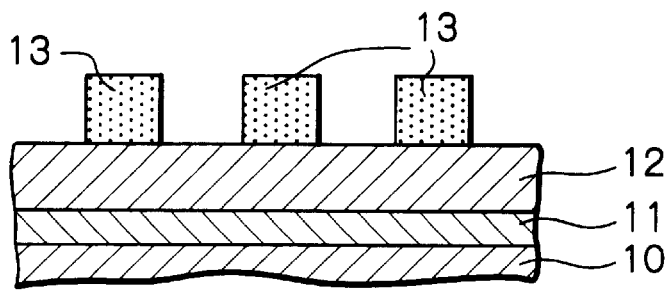

Then, as shown in FIG. 1b, on the layer to be etched 12, a resist layer 13 with a micro-pattern is formed by using a lithography technology. More concretely, for example, the patterned resist layer 13 is formed on the layer 12 by coating for example a positive type resist such as ZEP 520 with a thickness of 200 nm using the spin-coating method, by exposing a micro-pattern using an electron-beam exposure equipment, and then by developing the exposed resist pattern for five minutes at the room temperature using for example a developer ZED-N50 manufactured by Nihon Zeon Corp.

Figure 1C:
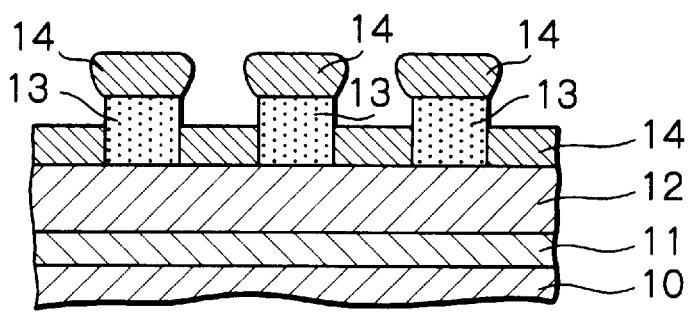

Then, as shown in FIG. 1c, on the micro-patterned resist layer 13 and on the layer to be etched 12, a mask layer 14 of a titanium nitride (TiN) is deposited. More concretely, for example, the titanium nitride layer is deposited by the sputtering method using reactive sputtering method (nitrogenation during deposition) using a mixture gas plasma of nitrogen and argon under the following conditions.

| Deposition conditions of the mask layer | |
| --- | --- |
| Target | 99.995% purity 4N5 titanium |
| Background pressure | $9 \times 10^{-6}$ Pa |
| Entered gas | argon and nitrogen gas |
| Rate of gas flow | 30 sccm |
| Total gas pressure | 0.15 Pa (during deposition) |
| Ratio of nitrogen gas | 0–60% |
| Applied power | DC 500 W |
| Distance between target and substrate | 300 mm |
| Rotation of substrate | None |
| Temperature of substrate | room temperature (cooling by cold water, no temperature control) |

Figure 1D:
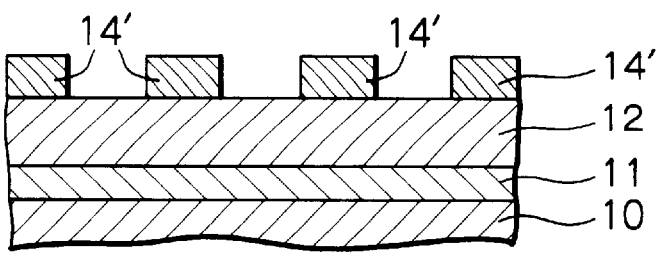

Then, as shown in FIG. 1d, the resist layer 13 is removed by the lift-off method to form a patterned mask 14'. More concretely, the lift-off is performed using an ultrasonic washer by dipping the wafer into a solvent such as a tetrahydrofuran.

Figure 1E:
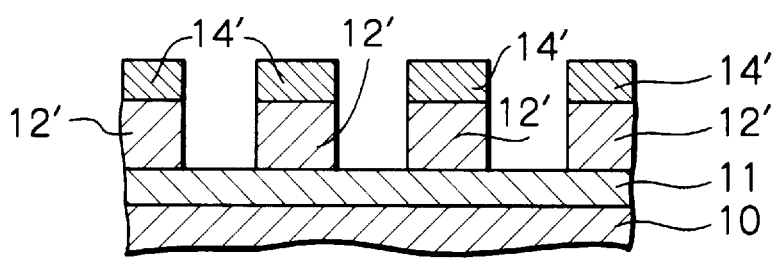
Figure 1F:
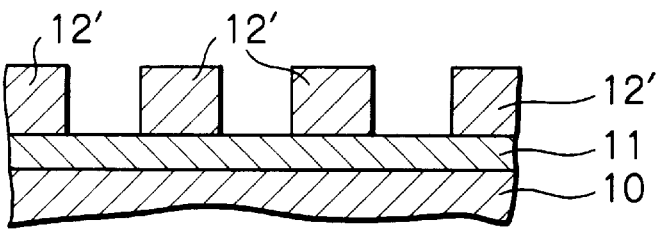

Thereafter, a reactive dry etching with a reaction mixture gas of ammonia and carbon monoxide is executed through the mask 14' to form a patterned or etched layer 12' shown in FIG. 1e.

Figure 2:
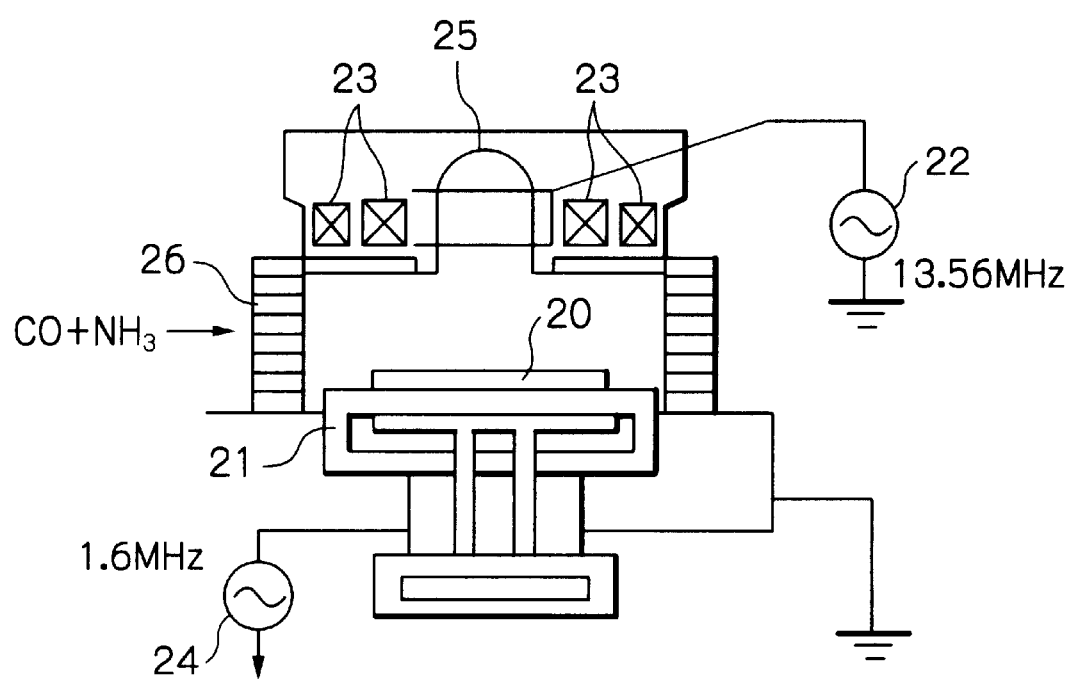
FIG. 2 shows a schematic view illustrating an example of a reactive ion etching equipment used in the embodiment shown in FIGS. 1d–1f.

FIG. 2 schematically illustrates an example of a reactive ion etching equipment used in this embodiment.

In the figure, reference numeral 20 denotes a wafer to be worked, 21 an ESC stage electrode for holding the wafer 20, 22 a RF power supply for generating a plasma (13.56 MHz), 23 an electromagnetic coil, 24 an RF bias power supply (1.6 MHz), 25 a quartz bell jar and 26 a diffusion chamber.

The etching conditions in this reactive etching equipment are as follows.

| Reactive dry etching conditions | |
| --- | --- |
| Entered gas | carbon monoxide gas and ammonia gas |
| Rate of carbon monoxide gas flow | 50 sccm |
| Rate of ammonia gas flow | 150 sccm |
| Total gas pressure | 6.0 Pa |
| Source power | 3 kW |
| Bias power | 1.2 kW |

Then, as shown in FIG. if, only the patterned or etched layer 12' with the micro-pattern is obtained by peeling off the mask 14'.

In this embodiment, the mask 14' is made of titanium nitride (TiN) with a very large ratio of the etching rate (etching selective ratio) with respect to cobalt-platinum alloy which makes the layer to be etched 12. As a result, according to this embodiment, the micro-pattern can be precisely transferred on the work layer.

Etching rates of various materials in the dry etching process using as a reaction gas a carbon monoxide gas with an additive of an ammonia gas were actually measured. Namely, samples were formed by depositing respectively a silicon dioxide ($SiO_2$), a titanium (Ti), a titanium nitride (TiN) and a cobalt-platinum alloy (CoPt) on a three-inches wafer under the same conditions as the aforementioned deposition conditions, and then the formed samples were dry-etched under the aforementioned dry etching conditions to measure the respective etching rates. The measured results and ratios in the measured etching rates (etching selective ratios) are shown in Table 1.

TABLE 1

| Material | Etching Rate (nm/min.) | Ratio in Etching Rate with respect to CoPt |
|---|---|---|
| $SiO_2$ | 12.5 | 3.6 |
| Ti | 3.6 | 12.4 |
| TiN | 1.7 | 26.3 |
| CoPt | 44.6 | — |

As shown in this table, the etching selective ratio of the titanium (Ti) is 12.4 whereas the etching selective ratio of the titanium nitride (TiN) is 26.3. Thus, if a mask is formed by the titanium nitride for the reactive dry etching using as a reaction gas a carbon monoxide gas with an additive of an ammonia gas, the mask itself will not be deformed by etching and also etching of the work layer will not progress from mask edge due to side etching. As a result, the fine micro-pattern can be transferred on a work layer with keeping its precise shape.

Figure 3A:
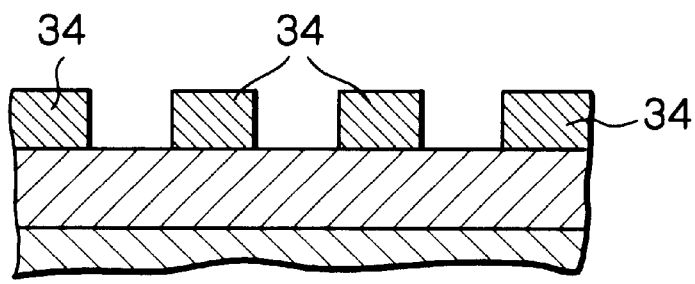
FIGS. 3a–3c show schematic diagrams illustrating islands shape actually formed by a reactive ion etching of a CoPt alloy using a Ti mask.
Figure 3B:
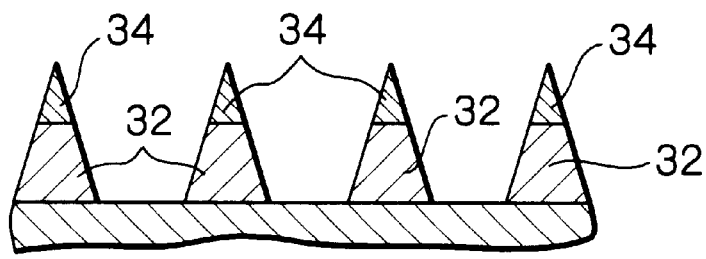
Figure 3C:
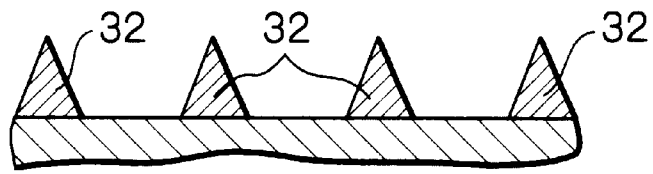
Figure 4A:
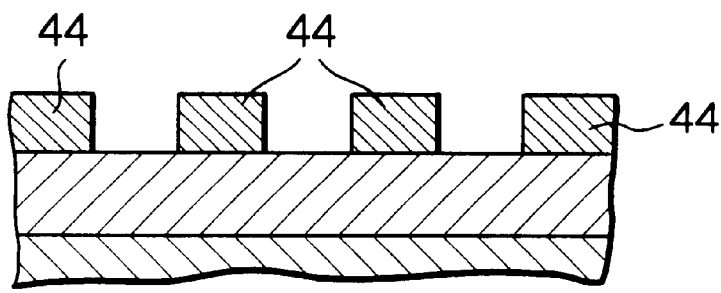
FIGS. 4a–4c show schematic diagrams illustrating islands shape actually formed by a reactive ion etching of a CoPt alloy using a TiN mask.
Figure 4B:
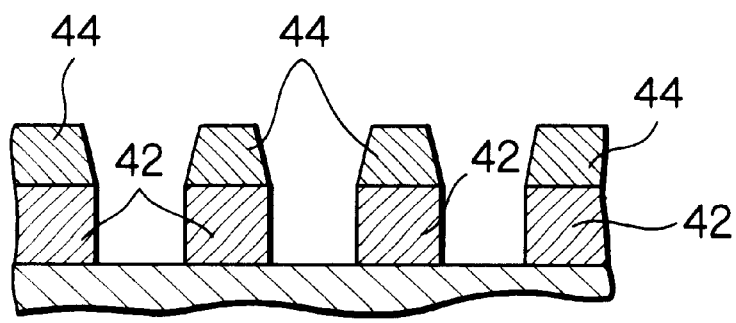
Figure 4C:
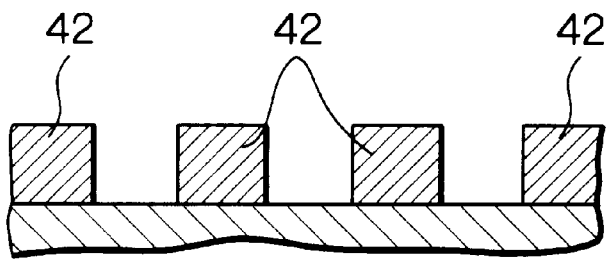

FIGS. 3a–3c schematically illustrate islands shape actually formed by a reactive dry etching of a CoPt alloy using a titanium (Ti) mask according to the conventional art under the aforementioned dry etching conditions, and FIGS. 4a–4c are schematically illustrate islands shape actually formed by a reactive ion etching of a CoPt alloy using a titanium nitride (TiN) mask according to the present invention under the aforementioned dry etching conditions. FIGS. 3a and 4a are shapes before the etching, FIGS. 3b and 4b are shapes after the etching but before exfoliation of the mask, and FIGS. 3c and 4c are shapes after exfoliation of the mask, respectively.

As will be apparent from FIGS. 3b and 3c, if the mask 34 was formed by the titanium, since the mask 34 did not sufficiently remain after the dry etching and side etching was progressing, each island 32 of the cobalt-platinum alloy finally formed was conical in shape. Contrary to this, as shown in FIGS. 4b and 4c, if the mask 44 was formed by the titanium nitride, since the mask 44 particularly its lower part sufficiently remained even after the dry etching, each island 42 of the cobalt-platinum alloy finally formed was kept in good and precise shape.

Figure 5:
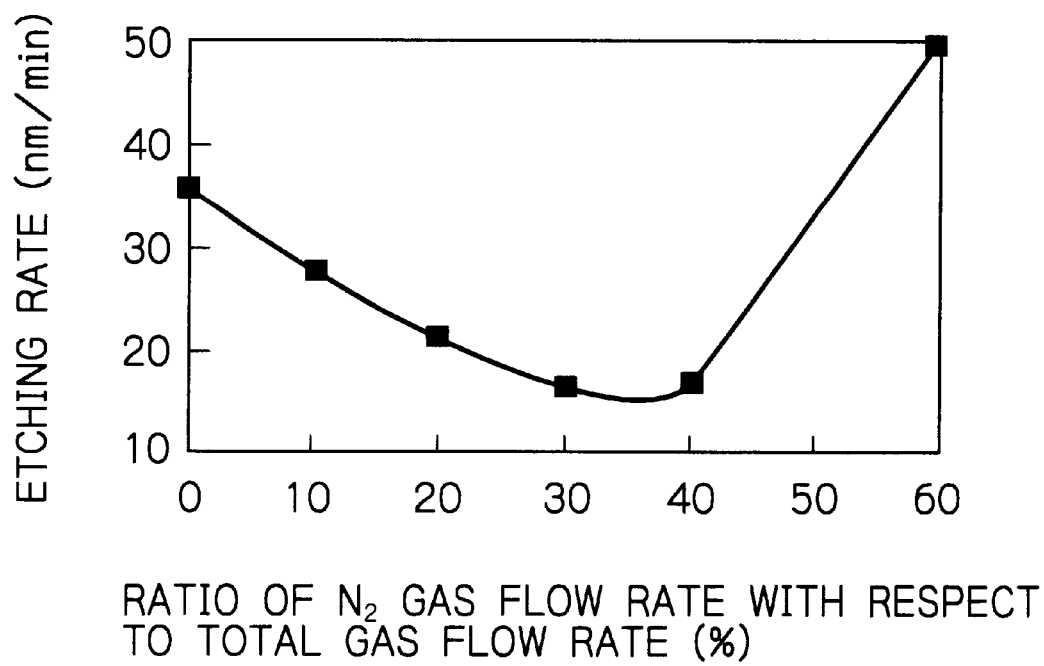
FIG. 5 shows a graph illustrating change in an etching rate of TiN with respect to a $N_2$ gas ratio during deposition.

When the titanium nitride layer is deposited by the reactive sputtering as done in this embodiment, the etching rate will change depending upon a ratio of the nitrogen gas with respect to the total gas. FIG. 5 illustrates change in the etching rate of the titanium nitride with respect to the nitrogen gas ratio during deposition. In the figure, the horizontal axis represents a ratio of a nitrogen gas flow rate with respect to a total gas flow rate $V_{N2}/(V_{Ar}+V_{N2})$ (%), and the vertical axis represents an etching rate in the dry etching using as a reactive gas a carbon monoxide gas with an additive of an ammonia gas (nm/min) where $V_{N2}$ is a nitrogen gas flow rate and $V_{Ar}$ is an argon gas flow rate. An etching rate at $V_{N2}/(V_{Ar}+V_{N2})=0\%$ corresponds to a titanium etching rate.

As will be noted form the figure, if $0\% < V_{N2}/(V_{Ar}+V_{N2}) \leq 50\%$, the etching rate of the titanium nitride is smaller than the etching rate of the titanium. Thus, it is preferred to keep this deposition condition in order to increase the etching selective ratio. Furthermore, since the etching rate becomes the minimum when $30\% \leq V_{N2}/(V_{Ar}+V_{N2}) \leq 40\%$, it is more preferred to keep this deposition condition in order to further increase the etching selective ratio.

When depositing the titanium nitride, a typical sputtering method using a target of the titanium nitride may be executed instead of the reactive sputtering method used in the aforementioned embodiment.

A nitrogen containing amine-family gas may be used other than the aforementioned ammonia ($NH_3$) gas, for the nitrogen containing compound gas added to the carbon monoxide gas as for a reaction gas in the dry etching process.

In the aforementioned embodiment, an example for forming many islands with a size of 0.1 μm or less on a magnetic material to be worked. However, the present invention is applicable to other microfabrication of the magnetic material and also to a microfabrication of other material such as a semiconductor material.

Many widely different embodiments of the present invention may be constructed without departing from the spirit and scope of the present invention. It should be understood that the present invention is not limited to the specific embodiments described in the specification, except as defined in the appended claims.

What is claimed is:

1. A microfabrication method comprising the steps of:
   forming a mask made of a titanium nitride on a layer to be etched by forming a resist pattern on said layer to be etched and reactive-sputtering a mask layer using a titanium target under a mixture gas of argon and nitrogen, a ratio X of a flow rate of said nitrogen gas with respect to a total gas flow rate being $30\% \leq X \leq 40\%$, where $X=V_{N2}/(V_{Ar}+V_{N2})$, $V_{N2}$ is a nitrogen gas flow rate and $V_{Ar}$ is an argon gas flow rate; and
   dry-etching said layer using said mask under a reaction gas of a carbon monoxide with an additive of $NH_3$, wherein said layer to be etched is composed of a cobalt-platinum alloy.

2. The method as claimed in claim 1, wherein said cobalt-platinum alloy has 75 at % Co and 25 at % Pt.

* * * * *